(12) United States Patent
Wang et al.

(10) Patent No.: US 12,160,967 B2
(45) Date of Patent: Dec. 3, 2024

(54) DISPLAY DEVICE

(71) Applicant: BOE TECHNOLOGY GROUP CO., LTD., Beijing (CN)

(72) Inventors: Wenbin Wang, Beijing (CN); Lei Cao, Beijing (CN); Junmin Sun, Beijing (CN); Zifeng Wang, Beijing (CN); Yan Ren, Beijing (CN); Yunpeng Wu, Beijing (CN); Jinggang Wei, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 17/799,803

(22) PCT Filed: Aug. 9, 2021

(86) PCT No.: PCT/CN2021/111529
§ 371 (c)(1),
(2) Date: Aug. 15, 2022

(87) PCT Pub. No.: WO2022/052703
PCT Pub. Date: Mar. 17, 2022

(65) Prior Publication Data
US 2023/0072288 A1   Mar. 9, 2023

(30) Foreign Application Priority Data
Sep. 11, 2020   (CN) .......................... 202010955635.2

(51) Int. Cl.
*H05K 5/02*     (2006.01)
*G09F 9/30*     (2006.01)
*H05K 5/00*     (2006.01)

(52) U.S. Cl.
CPC ......... *H05K 5/0234* (2013.01); *H05K 5/0018* (2022.08); *H05K 5/0208* (2013.01); *G09F 9/30* (2013.01)

(58) Field of Classification Search
CPC .. H05K 5/0234; H05K 5/0018; H05K 5/0208; G09F 9/30
See application file for complete search history.

(56) References Cited

U.S. PATENT DOCUMENTS

2008/0308686 A1   12/2008  Boltz et al.
2012/0081865 A1*   4/2012  Chang ................. H04M 1/0266
                                               361/679.01
(Continued)

FOREIGN PATENT DOCUMENTS

CN    200997031 Y    12/2007
CN    101189467 A     5/2008
(Continued)

OTHER PUBLICATIONS

China National Intellectual Property Administration, First office action of Chinese application No. 202010955635.2 Issued on Sep. 14, 2021, which is foreign counterpart application of this US application.

(Continued)

*Primary Examiner* — Anita M King
(74) *Attorney, Agent, or Firm* — Lippes Mathias LLP

(57) ABSTRACT

Provided is a display device. The display device includes: a support base, a support frame connected to the support base, a glass panel connected to the first support surface, and a display disposed within a cavity formed by the support frame, the support base, and the glass panel. The display is connected to the support frame. The support frame includes: a plurality of support bars, and a movable connection member disposed between each two support bars of the plurality of support bars and configured to connect the two (Continued)

support bars, wherein each of the support bar and the movable connection member is provided with a first support surface, and the movable connection member is configured to move between the two support bars to adjust a size of the support frame.

19 Claims, 13 Drawing Sheets

(56) References Cited

U.S. PATENT DOCUMENTS

| | | | |
|---|---|---|---|
| 2015/0072555 | A1 | 3/2015 | Riddiford et al. |
| 2017/0038631 | A1 | 2/2017 | Ma et al. |
| 2017/0134860 | A1 | 5/2017 | Kuksenkov et al. |
| 2020/0017295 | A1 | 1/2020 | Duijts et al. |
| 2022/0400563 | A1 | 12/2022 | Wu et al. |
| 2024/0077760 | A1* | 3/2024 | Liu .................. G02F 1/133322 |

FOREIGN PATENT DOCUMENTS

| | | |
|---|---|---|
| CN | 201584118 U | 9/2010 |
| CN | 204479876 U | 7/2015 |
| CN | 204650943 U | 9/2015 |
| CN | 204884475 U | 12/2015 |
| CN | 105278130 A | 1/2016 |
| CN | 105926816 A | 9/2016 |
| CN | 107212651 A | 9/2017 |
| CN | 206849410 U | 1/2018 |
| CN | 107680484 A | 2/2018 |
| CN | 207476051 U | 6/2018 |
| CN | 108597367 A | 9/2018 |
| CN | 207883212 U | 9/2018 |
| CN | 208110974 U | 11/2018 |
| CN | 209149714 U | 7/2019 |
| CN | 209484199 U | 10/2019 |
| CN | 210055465 U | 2/2020 |
| CN | 210091669 U | 2/2020 |
| CN | 210606553 U | 5/2020 |
| CN | 211044865 U | 7/2020 |
| CN | 111594514 A | 8/2020 |
| CN | 112050047 A | 12/2020 |
| JP | 2004195160 A | 7/2004 |
| JP | 2012013720 A | 1/2012 |

OTHER PUBLICATIONS

China National Intellectual Property Administration, Notification to grant patent right for invention of Chinese application No. 202010955635.2 issued on Feb. 25, 2022, which is foreign counterpart application of this US application.

Juan Ye et al., Innovative Research on Removable Display Mounting Structure of Intelligent Network Refrigerator, Appliance Technology, Issue 07, pp. 22-25, Jul. 15, 2017.

* cited by examiner

DISPLAY DEVICE

CROSS-REFERENCE TO RELATED APPLICATION

This application is a 371 of PCT application No. PCT/CN2021/111529, filed on Aug. 9, 2021, which claims priority to Chinese Patent Application No. 202010955635.2, filed on Sep. 11, 2020 and entitled "DISPLAY DEVICE," the disclosures of which are herein incorporated by reference in their entireties.

TECHNICAL FIELD

The present disclosure relates to the field of display technologies, and in particular, relates to a display device.

BACKGROUND

With the development of science and technology, the digital display technology is employed everywhere. At present, digital signage can display and publish various information, advertisements, and other contents, and are widely used in various public places.

Currently, the digital signage may generally include: a support base, a support frame connected to the support base, and a display disposed within the support frame, wherein the support frame is provided with a support surface. The digital signage may further include: a glass panel disposed on the support surface, wherein an edge region of the glass panel may be bonded to the support surface, so as to achieve connection between the glass panel and the support frame.

SUMMARY

Embodiments of the present disclosure provide a display device, which solves a problem of size mismatch that occurs in the case that a glass panel and a support frame are assembled together in the related art. The technical solutions are as follows:

In an aspect, a display device is provided. The display device includes:
 a support base;
 a support frame connected to the support base, wherein the support frame includes: a plurality of support bars, and a movable connection member disposed between each two support bars of the plurality of support bars and configured to connect the two support bars, wherein each of the support bar and the movable connection member is provided with a first support surface, and the movable connection member is configured to move between the two support bars to adjust a size of the support frame;
 a glass panel connected to the first support surface; and
 a display disposed within a cavity formed by the support frame, the support base, and the glass panel, wherein the display is connected to the support frame.

In some embodiments, the movable connection member is provided with a first slide member, and an end, of the support bar, connected to the movable connection member is provided with a second slide member engaged with the first slide member, wherein the first slide member is slidably connected to the second slide member.

In some embodiments, the first slide member includes a first protrusion structure, and the second slide member includes a first recess structure engaged with the first protrusion structure; or the first slide member includes a first recess structure, and the second slide member includes a first protrusion structure engaged with the first recess structure;
 wherein the first protrusion structure is configured to slide in the first recess structure.

In some embodiments, the support frame further includes: a fastener structure configured to fix the support bar and the movable connection member.

In some embodiments, the fastener structure includes: a fastener hole communicated with the first recess structure, an adjustment hole disposed in the first protrusion structure, and a fastener member:
 wherein a first end of the fastener member is provided with a fastener sheet configured to abut against the first protrusion structure, and a second end of the fastener member is connected to the fastener hole upon passing through the adjustment hole.

In some embodiments, the adjustment hole in the first protrusion structure is a waist-shaped hole, wherein a length direction of the waist-shaped hole being consistent with a length direction of the support bar connected to the first protrusion structure.

In some embodiments, each of the support bar and the movable connection member includes: a protection structure and a bearing structure that are connected to each other, wherein the protection structure is protruded relative to the bearing structure, and the bearing structure is provided with a first support surface, the first support surface being bonded to the glass panel.

In some embodiments, the support frame further includes: a shock-absorption bar, wherein a first end of the shock-absorption bar is connected to one of the support bars, a second end is connected to another one of the support bars, and the shock-absorption bar is configured to abut against the glass panel.

In some embodiments, the shock-absorption bar includes: a first sub-shock-absorption bar and a second sub-shock-absorption bar that are connected to each other, wherein the first sub-shock-absorption bar is configured to abut against a side surface of the glass panel, and the second sub-damping bar is configured to support an edge region of the glass panel.

In some embodiments, the support frame includes: a first support bar, a second support bar, and a third support bar, wherein the first support bar and the second support bar are connected by one of the movable connection members, and the second support bar is connected to with the third support bar by another one of the movable connection members:
 An end, distal from the movable connection member, of the first support bar is connected to the first end of the shock-absorption bar; and an end, distal from the movable connection member, of the third support bar is connected to the second end of the shock-absorption bar.

In some embodiments, the support base includes: a base body provided with two first connection member: wherein
 two support bars of the plurality of support bars are each provided with a second connection member, the second connection member being disposed on an end, distal from the movable connection member, of each of the two support bars;
 wherein the first connection member is configured to be connected to the second connection member.

In some embodiments, the first connection member includes a second protrusion structure, and the second connection member includes a second recess structure engaged with the second protrusion structure; or the first connection member includes a second recess structure, and the second connection member includes a second protrusion structure engaged with the second recess structure;

wherein the second protrusion structure is disposed within the second recess structure.

In some embodiments, the support base further includes: a counterweight plate connected to a side, distal from the support frame, of the base body.

In some embodiments, the first support surface is inclined relative to a bottom surface of the support base.

In some embodiments, each of the support bar and the movable connection member is further provided with a second support surface, and the display device further includes: a back plate connected to the second support surface.

The technical solutions according to the embodiments of the present disclosure at least achieve the following beneficial effects:

The display device may include a support base, a support frame, a glass panel, and a display. The support frame includes a plurality of support bars, and a movable connection member disposed between each two support bars of the support bars and configured to connect the two support bars. The movable connection member is movable between the two support bars to adjust a size of the support frame. By adjusting the size of the support frame, the support frame is adapted to the glass panel even with a machining error. In this way, under the premise that the glass panel is assembled onto the support frame, the gap between the support frame and the glass panel is avoided, and the risk that the glass panel is crushed by the support frame is eliminated.

BRIEF DESCRIPTION OF THE DRAWINGS

For clearer descriptions of the technical solutions in the embodiments of the present disclosure, accompanying drawings required for describing the embodiments are briefly introduced hereafter. Obviously, the accompanying drawings in the following description show merely some embodiments of the present disclosure, and a person of ordinary skill in the art may further derive other drawings from these accompanying drawings without creative efforts.

DETAILED DESCRIPTION

In the related art, a machining error is usually present when the glass panel and the support frame are processed. In this way, size mismatch often occurs in the case that the glass panel and the support frame are assembled. For example, in the case that the support frame is excessively large, although the glass panel may be bonded to the support surface of the support frame, a gap may be present between the support frame and the glass panel: in the case that the support frame is excessively small, it is difficult to bond the glass panel to the support surface of the support frame. In this case, even in the case that the glass panel is smoothly bonded to the support surface of the inner support frame, the glass panel is still subject to a risk of being crushed by the support frame.

For clearer descriptions of the purposes, technical solutions, and advantages of the present disclosure, the embodiments of the present disclosure are described in detail hereinafter with reference to the accompanying drawings.

Figure 1:
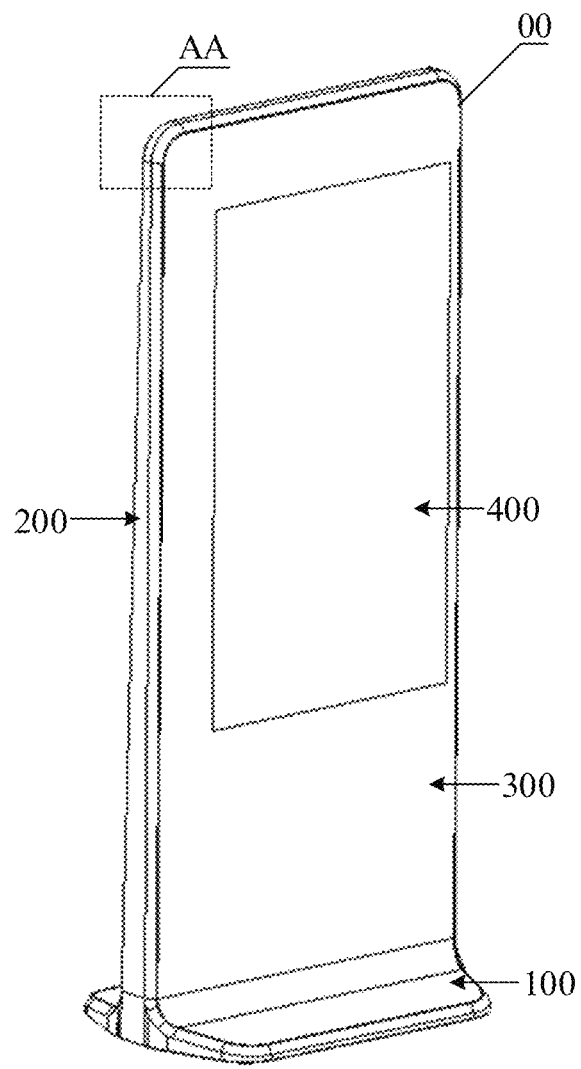
FIG. 1 is a schematic structural diagram of a display device according to an embodiment of the present disclosure.
Figure 2:
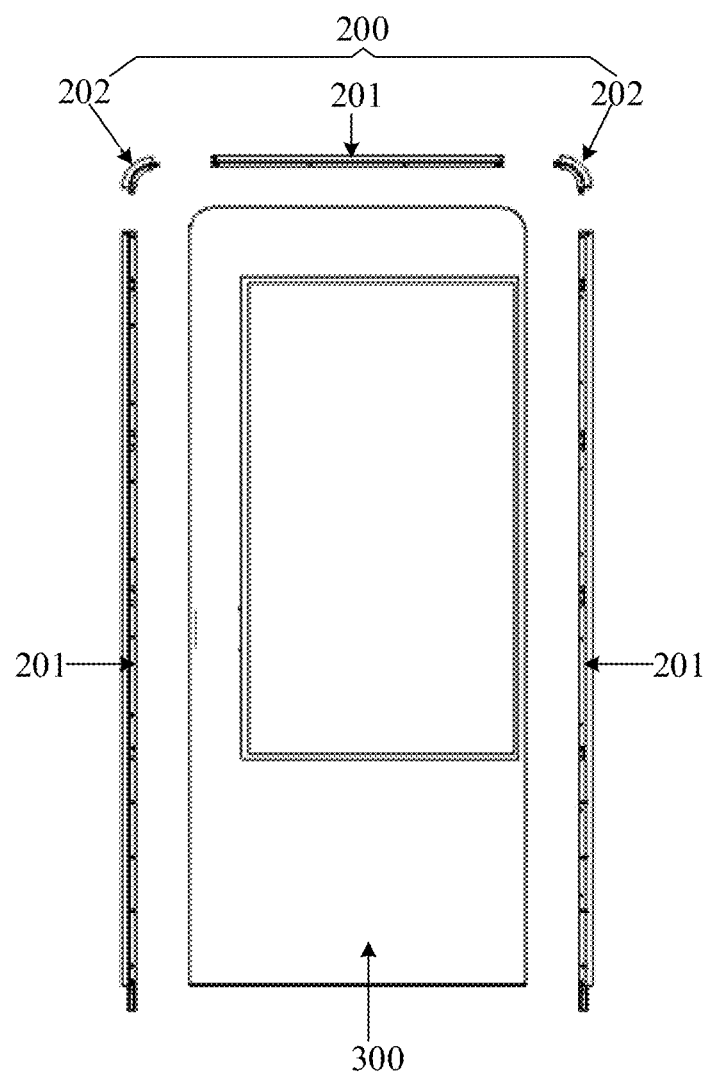
FIG. 2 is an exploded view of a support frame in the display device shown in FIG. 1.

Referring to FIG. 1, which is a schematic structural diagram of a display device according to an embodiment of the present disclosure, display device 00 may be a digital signage. The display device 00 may include:

a support base 100, a support frame 200, a glass panel 300, and a display 400. The support frame 200 may be connected to the support base 100. To see the structure of the support frame 200 more clearly, a reference is made to FIG. 2, which is an exploded view of the support frame in the display device shown in FIG. 1.

The support frame 200 may include: a plurality of support bars 201, and movable connection members 202, disposed between every two support bars, configured to connect the two support bars. In the embodiment of the present disclosure, the movable connection member 202 may connect two adjacent support bars 201 among the plurality of support bars 201. In this way, the plurality of support bars 201 may be sequentially connected by the movable connection members 202.

In the embodiment of the present disclosure, the movable connection member 202 in the support frame 200 is configured to be moved between the two support bars 201, to adjust a size of the support frame 200. For example, the movable connection member 202 is moved between the two support bars 201, such that a length of the support frame 200 formed by the movable connection member 202 and the support bar 201 is adjusted. For example, the movable connection member 202 may be moved along a length direction of each of the two support bars 201 (i.e., the direction of a length of the support bar 201), such that the length of the support frame 200 is adjusted.

Figure 3:
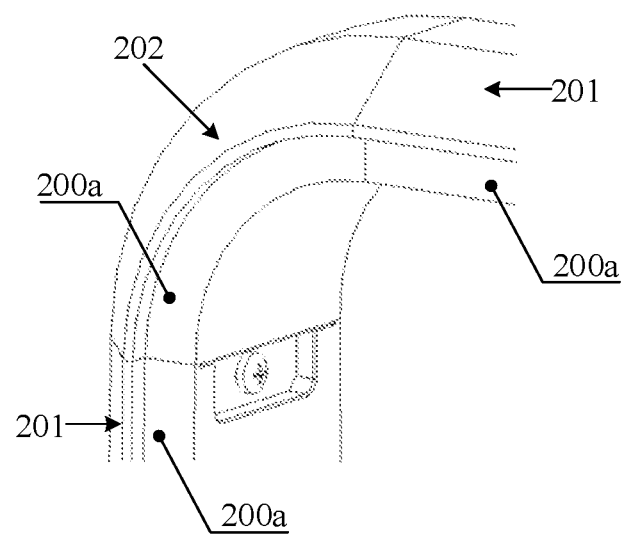
FIG. 3 is a partially enlarged view, at a side A-A, of the display device shown in FIG. 1.

For details about the structure of the support bar 201 and the movable connection member 202, reference is made to FIG. 3, which is a partially enlarged view, at a side A-A, of the display device shown in FIG. 1. Each of the support bar 201 and the movable connection member 202 is provided with a first support surface 200a. In the embodiment of the present disclosure, various first support surfaces 200a of each of the plurality of support bars 201 and a plurality of movable connection members 202 that are in the support frame 200 may be coplanar. In this way, each first support surface 200a of each of the support bars 201 and the movable connection members 202 may be connected to a glass panel 300. The glass panel 300 is connected to the first support surface 200a, such that the connection between the glass panel 300 and the support frame 200 is realized.

The display 400 in the display device 00 may be disposed in a cavity (not illustrated in FIG. 1) formed by the support frame 200, the support base 100 and the glass panel 300, wherein the display 400 may be connected to the support frame 200. In the embodiment of the present disclosure, the display 400 may include a display panel, and a display controller for driving the display panel to display.

In the embodiment of the present disclosure, the movable connection member 202 in the support frame 200 is movable between the two support bars 201, such that the size of the support frame 200 is adjusted. In this way, the size of the support frame 200 in the display device 00 is adjusted by the movable connection member 202, such that the support frame 200 is adapted to the glass panel 300 even with a machining error. As a result, a gap between the support frame 200 and the glass panel 300 is avoided on a premise that the glass panel 300 is assembled onto the support frame 200. Moreover, a risk that the glass panel 300 is crushed by the support frame 200 is eliminated.

In summary, the display device according to the embodiment of the present disclosure includes: the support base, the support frame, the glass panel, and the display. The support frame includes the plurality of support bars, and the movable connection member, disposed between the two support bars, configured to connect the two support bars. The movable connection member is moved between the two support bars to adjust the size of the support frame. By adjusting the size of the support frame, the support frame is adapted to the glass panel even with a machining error. In this way, under the premise of ensuring that the glass panel is assembled onto the support frame, the gap between the support frame and the glass panel is avoided, and the risk that the glass panel is crushed by the support frame is eliminated.

Figure 4:
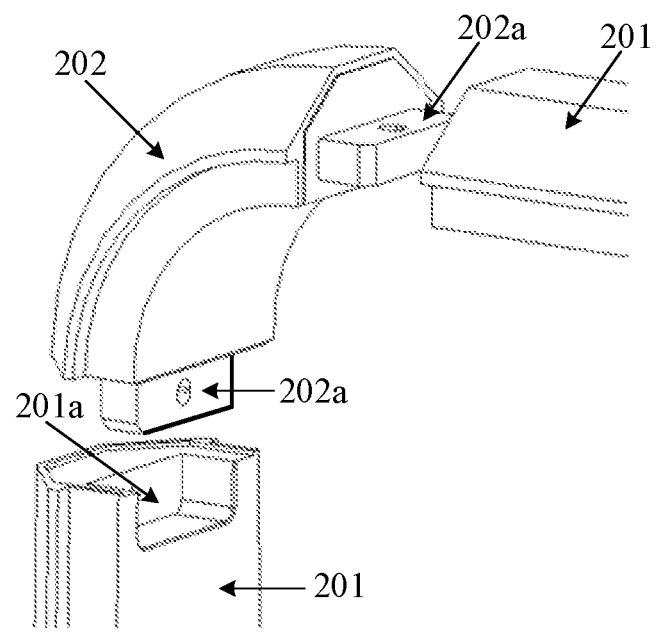
FIG. 4 is a partially exploded view of a support frame according to an embodiment of the present disclosure.

In the embodiment of the present disclosure, as shown in FIG. 4, which is a partially exploded view of a support frame according to the embodiment of the present disclosure, the movable connection member 202 is provided with a first slide member 202a. For example, the movable connection member 202 is provided with two first slide members 202a. An end, of the support bar 201, connected to the movable connection member 202 is provided with a second slide member 201a engaged with the first slide member 202a. The first slide member 202a may be slidably connected to the second slide member 201a. In this way, the movable connection member 202 is moved between the two adjacent support bars 201 by the sliding between the first slide member 202a and the second slide member 201a.

Exemplarily, in the case that the size of the support frame 200 needs to be adjusted, the distance between the movable connection member 202 and the support bar 201 connected to the movable connection member 202 may be adjusted by the sliding connection between the first slide member 202a and the second slide member 201a. Therefore, a length of the structure formed by the movable connection member 202 and the support bar 201 is increased or decreased, and the size of the support frame 200 is adjusted.

In the embodiment of the present disclosure, the first slide member 202a and the second slide member 201a may be snap-fit to each other. In this way, the movable connection member 202 is connected to the two adjacent support bars 201 by snap-fitting between the first slide member 202a and the second slide member 201a.

Figure 5:
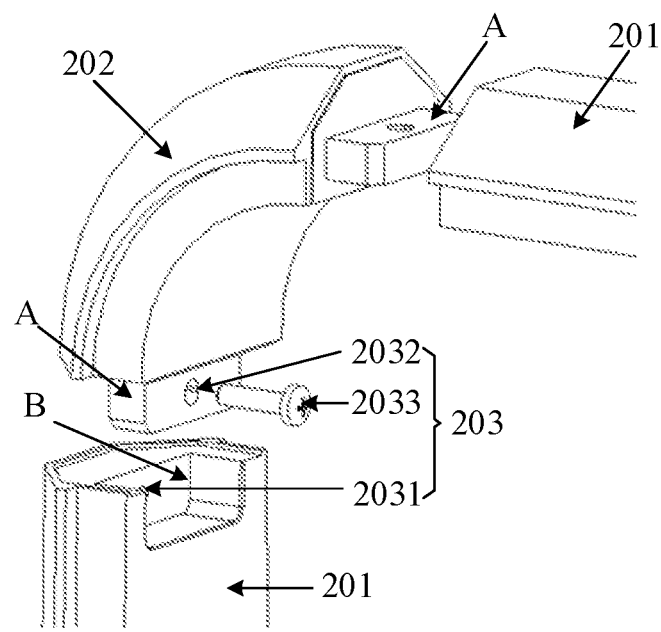
FIG. 5 is a partially exploded view of another support frame according to an embodiment of the present disclosure.

It should be noted that the structures of the first slide member 202a and the second slide member 201a in the embodiments of the present disclosure may be practiced in various ways. The embodiments of the present disclosure take the following two exemplary implementations as examples for illustrative description:

In a first exemplary implementation, as shown in FIG. 5, which is a partially exploded view of another support frame according to an embodiment of the present disclosure, the first slide member in the movable connection member 202 may include a first protrusion structure A, and the second slide member in the support bar 201 may include a first recess structure B engaged with the first protrusion structure A.

Figure 6:
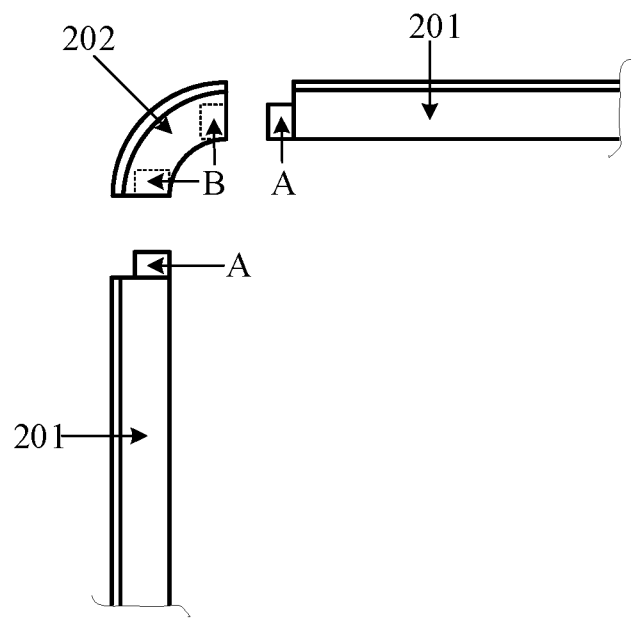
FIG. 6 is a partially exploded view of still another support frame according to an embodiment of the present disclosure.

In a second exemplary implementation, as shown in FIG. 6, which is a partially exploded view of another support frame according to an embodiment of the present disclosure, the first slide member in the movable connection member 202 may include a first recess structure B, and the second slide member in the support bar 201 may include a first protrusion structure A engaged with the first recess structure B.

In the embodiment of the present disclosure, the first protrusion structure A may be snap-connected to the first recess structure B, and the first protrusion structure A may slide in the first recess structure B. In this way, two adjacent support bars 201 may be connected by the movable connection member 202, and the movable connection member 202 is moved between the two adjacent support bars 201.

In the embodiment of the present disclosure, to realize the fastener connection between the support bar 201 in the support frame 200 and the movable connection member 202, the two following implementations may be used.

In one implementation, the fastening connection between the support bar 201 and the movable connection member 202 may be realized by an interference fit between first protrusion structure A and the first recess structure B. In the case that the size of the support frame 200 needs to be adjusted, the first protrusion structure A needs to be pushed, under the action of an external force, to be moved within the first recess structure B, such that the movable connection member 202 is moved between two adjacent support bars.

Figure 7:
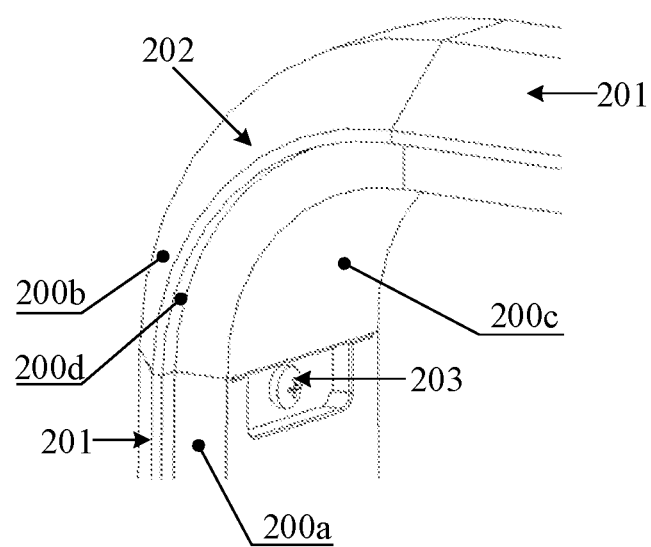
FIG. 7 is a schematic structural diagram of each component, being combined, in the support frame shown in FIG. 5.

In another implementation, as shown in FIG. 5 and FIG. 7, FIG. 7 is a schematic structural diagram of each component, being combined, in the support frame shown in FIG. 5. The support frame 200 may further include: a fastener structure 203. The fastener structure 203 is configured to fix the support bar 201 and the movable connection member 202 in the support frame 200. In this case, interference fit between the first protrusion structure A and the first recess structure B is not needed. A distance may be present between the first protrusion structure A and the first recess structure B, and the distance may range from 0.2 to 1.5 mm. In this way, in the case that the size of the support frame 200 needs to be adjusted, the first protrusion structure A may be more conveniently pushed to be moved within the first recess structure B, such that the movable connection member 202 is moved between two adjacent support bars 201.

Exemplarily, the fastener structure 203 in the support frame 200 may include: a fastener hole 2031, an adjustment hole 2032 and a fastener member 2033.

The fastener hole 2031 is usually disposed in the support bar 201 or the movable connection member 202 that are provided with the first recess structure B, and the fastener hole 2031 needs to be communicated with the first recess structure B.

The adjustment hole 2032 may be disposed in the first protrusion structure A, and the adjustment hole 2032 may be communicated with the fastener hole 2031.

A first end of the fastener member 2033 is provided with a fastener sheet (not illustrated in FIG. 5) configured to abut against the first protrusion structure A, and a second end of the fastener member 2033 may be connected to the fastener hole upon passing through the adjustment hole 2032.

In the embodiment of the present disclosure, the adjustment hole 2032 in the first protrusion structure A may be a waist-shaped hole, and a length direction of the waist-shaped hole may be identical to a length direction of the support bar 201 connected to the first protrusion structure. The adjustment hole 2032 is communicated with the fastener hole 2031, and the length direction of the adjustment hole 2032 is identical to the length direction of the corresponding support bar 201. During the process of the movable connection member moving along the length direction of the support bar 201, the adjustment hole 2032 is always communicated with the fastener hole 2031. In this way, in the case that the relative position between the movable connection member 202 and the support bar 201 is changed, the fastener member 2033 may be communicated with the fastener hole 2031 upon smoothly extending through the adjustment hole 2032. In this way, the movable connection member 202 may move between the two adjacent support bars 201, and may also be fastened to the two adjacent support bars 201.

In some embodiments, the fastener member 2033 may be a screw, and the fastener hole 2031 may be a threaded hole engaged with the screw. In this way, in the case that the size of the support frame 200 needs to be adjusted, the fastener member 2033 connected to the movable connection member 202 may be loosened, and the movable connection member 202 may be moved along the length direction of at least one of the two adjacent support bars 201 connected to the movable connection member 202, so as to adjust the size of the support frame 200. In the case that the size of the support frame 200 is adjusted, the fastener members 2033 connected to the movable parts may be tightened, such that the movable connection member 202 and the support bar 201 in the support frame 200 are fastened and connected to each other.

In the embodiment of the present disclosure, as shown in FIG. 7, each of the support bar 201 and the movable connection member 202 that are in the support frame 200 includes: a protection structure 200b and a bearing structure 200c that are connected to each other. The protection structure 200b is protruded relative to the bearing structure 200c, and the bearing structure 200c is provided with a first support surface 200a. The glass panel 300 in the display device 00 may be bonded to the first support surface 200a, for example, the glass panel 300 and the first support surface 200a may be bonded together by a back adhesive.

Exemplarily, an edge region of the glass panel 300 may be bonded to the first support panel 200a on the bearing structure 200c, and a side surface of the glass panel 300 may be in contact with 200d, of the protection structure 200b, proximal to the bearing structure 200c. The glass panel 300 may be protected by the protection structure 200b, such that the edge of the glass panel 300 is prevented from being damaged.

Figure 8:
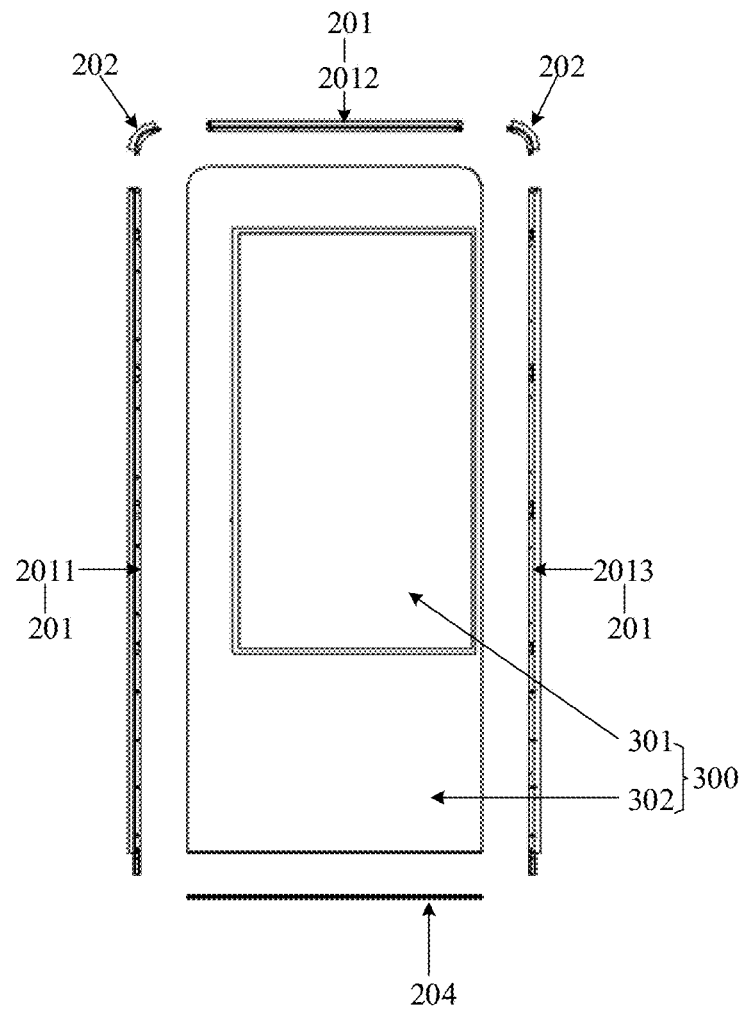
FIG. 8 is an exploded view of a support frame in a display device according to an embodiment of the present disclosure.

In an embodiment of the present disclosure, as shown in FIG. 8, which is an exploded view of a support frame in a display device according to an embodiment of the present disclosure. The support frame 200 in the display device 00 may further include: a shock-absorption bar 204. A first end of the shock-absorption bar 204 is connected to one support bar 201 of the plurality of support bars 201, and the other end of the shock-absorption bar 204 is connected to another support bar 201 of the plurality of support bars 201. The shock-absorption bar 204 is configured to abut against the glass panel 300. The shock-absorption bar 204 exerts a shock-absorption effect on the glass panel 300, such that the probability of the glass panel 300 being shattered caused by vibrations generated during the removal of the display device 00 is reduced.

Figure 9:
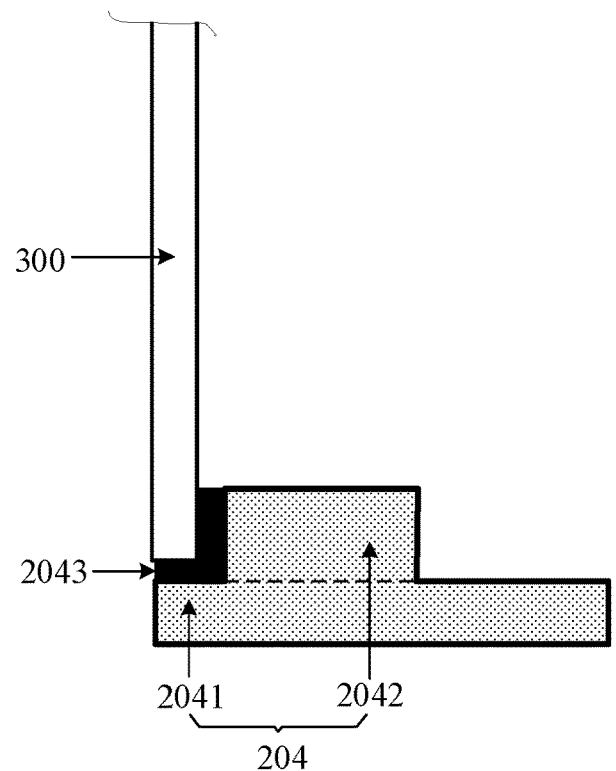
FIG. 9 is a cross-sectional view of a shock-absorption bar according to an embodiment of the present disclosure.

Exemplarily, as shown in FIG. 9, which is a cross-sectional view of a shock-absorption bar according to an embodiment of the present disclosure, the shock-absorption bar 204 may include a first sub-shock-absorption bar 2041 and a second sub-shock-absorption bar 2042 that are connected to each other. In the embodiment of the present disclosure, the first sub-shock-absorption bars 2041 and the second sub-shock-absorption bars 2042 may be integrated. The first sub-shock-absorption bar 2041 is configured to abut against the side surface of the glass panel 300, and the second sub-shock-absorption bar 2042 is configured to support the edge region of the glass panel 300.

Figure 10:
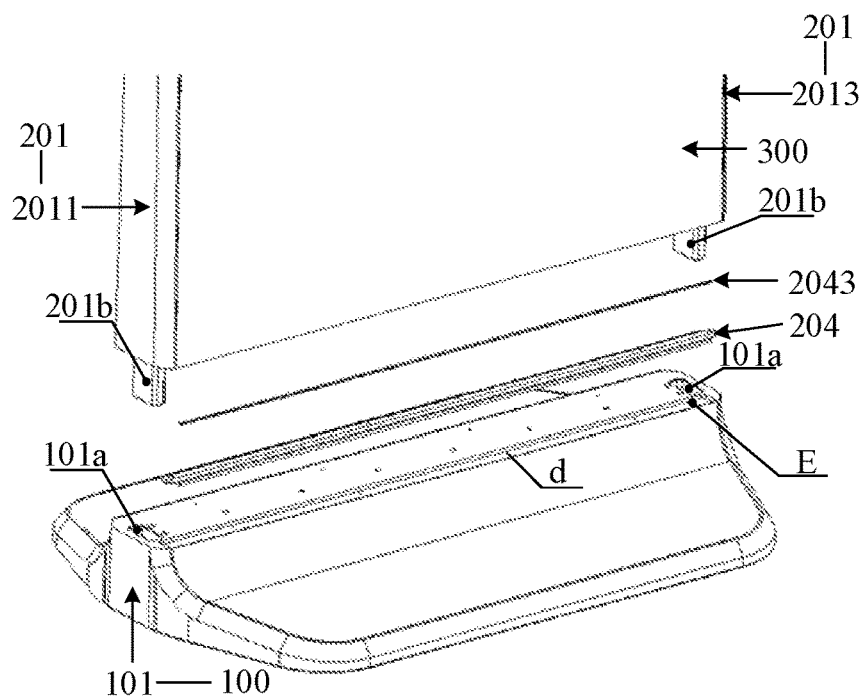
FIG. 10 is a partially enlarged view of a display device according to an embodiment of the present disclosure.

In some embodiments, as shown in FIG. 9 and FIG. 10, FIG. 10 is a partially enlarged view of a display device according to an embodiment of the present disclosure. The shock-absorption bar 204 may further include: a shock-absorption foam 2043 disposed on the first sub-shock bar 2041 and the second sub-shock bar 2042. The shock-absorption foam 2043 may usually be disposed between the glass panel 300 and each one of the first sub-shock-absorption bar 2041 and the second sub-shock-absorption-bar 2042. The shock-absorption foam 2043 further exerts a shock-absorption effect on the glass panel 300, such that the probability that the glass panel 300 is shattered caused by vibrations generated during the removal of the display device 00 is which further reduced.

In the embodiment of the present disclosure, the edge region of the glass panel 300 may be supported by the support bar 201 and the movable connection member 202, and the second sub-absorbing bar 2042 in the shock-absorption bar 204. The side surface of the glass panel 300 may be supported by the first sub-absorbing bar 2041 in the shock-absorption bar 204. In this way, the support frame 200 formed by the support bar 201, the movable connection member 202 and the shock-absorption bar 204 can support the glass panel 300.

Exemplarily, as shown in FIG. 8 and FIG. 10, the plurality of support bars 201 in the support frame 200 may include: a first support bar 2011, a second support bar 2012, and a third support bar 2013. The first support bar 2011 and the second support bar 2012 are connected by one movable connection member 202, and the second support bar 2012 and the third support bar 2013 are connected by another movable connection member 202. An end, distal from the movable connection member 202, of the first support bar 201₁ may be connected to the first end of shock-absorption bar 204. An end, distal from the movable connection member 202, of the third support bar 201₃ may be connected to the second end of the shock-absorption bar 204 connect.

In the embodiment of the present disclosure, the support frame 200, formed by the first support bar 201₁, the second support bar 201₂ and the third support bar 201₃, as well as the two movable connection members 202 and the shock-absorption bar 204, may be a rectangular support frame.

Figure 11:
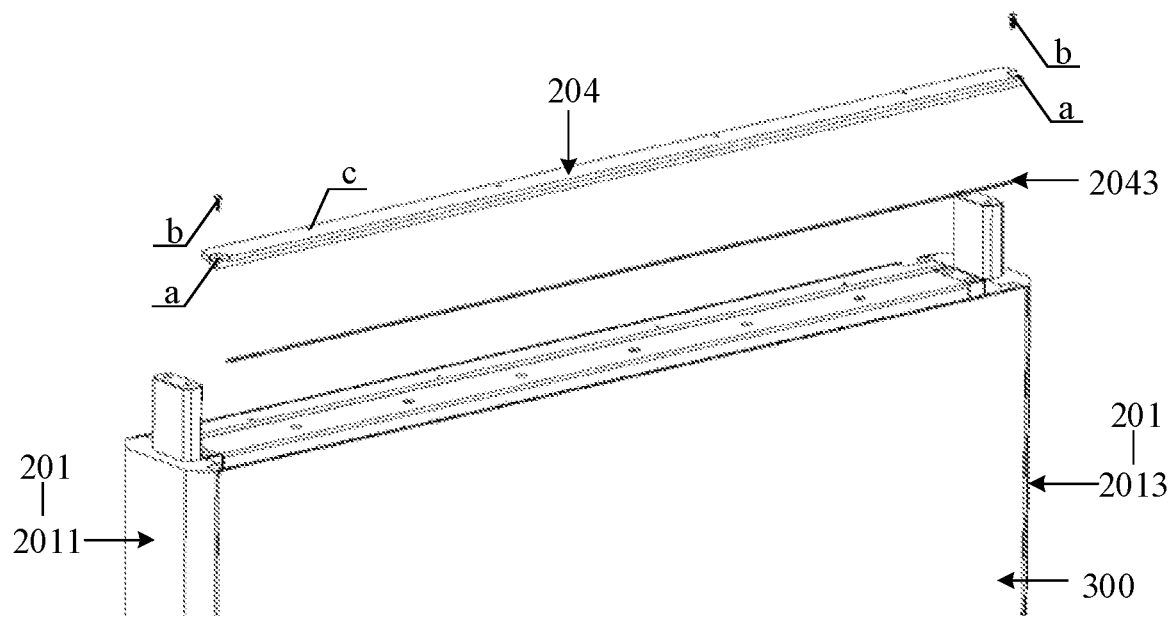
FIG. 11 is a schematic diagram of a shock-absorption bar and a support bar being assembled together according to an embodiment of the present disclosure.

Exemplarily, as shown in FIG. 11, which is a schematic diagram of a shock-absorption bar and a support bar being assembled together according to an embodiment of the present disclosure, both ends of the shock-absorption bar 204 are provided with a first through hole a, and the first support bar 201₁ is provided with a first threaded hole (not illustrated in FIG. 11) communicated with the first through hole a at a first end of the shock-absorption bar 204, and the third support bar 201₃ is provided with a first threaded hole (not illustrated in FIG. 11) communicated with the first through hole a at a second end of the shock-absorption bar 204. A first screw b may be screwed with the first threaded hole upon passing through the first through hole a. In this way, the first end of the shock-absorption bar 204 and the first support bar 201₁ are connected, and the second end of the shock-absorption bar 204 and the third support bar 201₃ are connected.

In some embodiments, as shown in FIG. 10, the support base 100 may include: a base body 101. The base body 101 is provided with two first connection members 101a. Two support bars 201, of the plurality of support bars 201 in the support frame 200, are provided with a second connection member 201b. The second connection member 201b of the support bar 201 is disposed on an end, distal from the movable connection member 202, of each of the two support bars 201. For example, an end, distal from the movable connection member 202, of each of the first support bar 201₁ and the third support bar 201₃ of the plurality of support bars 201 is provided with the second connection member 201b.

Figure 12:
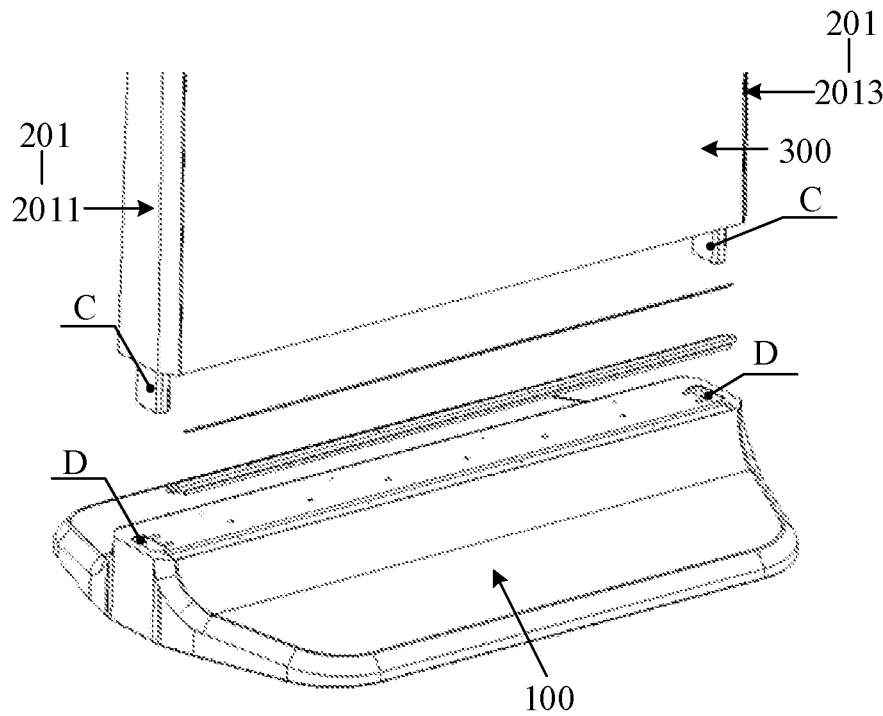
FIG. 12 is a partially enlarged view of yet another display device according to an embodiment of the present disclosure.

In the embodiment of the present disclosure, the first connection member 101a on the base body 101 is configured to be connected to the second connection member 201b, such that connection between the support frame 200 and the support base 100 is realized. It should be noted that, the first connection member 101a and the second connection member 201b in the embodiment of the present disclosure may be realized in various ways. The embodiments of the present disclosure take the following two optional implementations as examples for illustrative description:

In a first optional implementation, as shown in FIG. 12, which is a partially enlarged view of another display device according to an embodiment of the present disclosure, the first connection member on the base body 101 may include a second protrusion structure C, and the second connection member on the support bar 201 may include a second recess structure D engaged with the second protrusion structure C.

Figure 13:
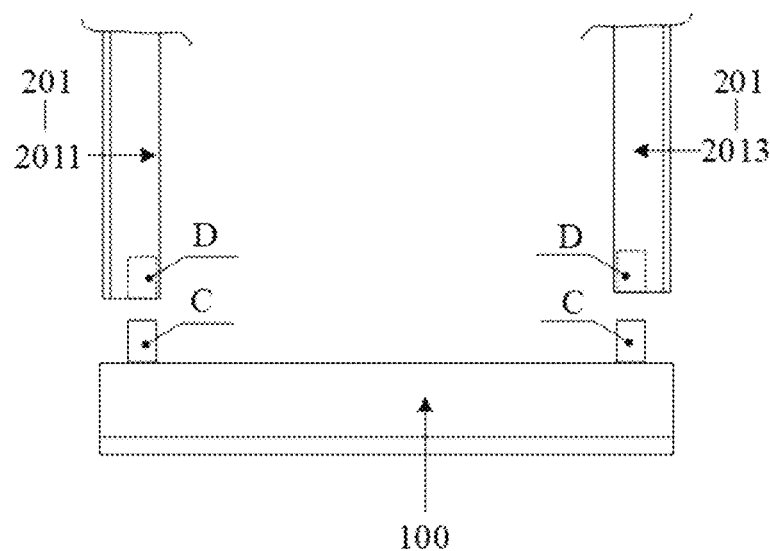
FIG. 13 is a partially enlarged view of another display device according to an embodiment of the present disclosure.

In a second optional implementation, as shown in FIG. 13, which is a partially enlarged view of another display device according to an embodiment of the present disclosure, the first connection member on the base body 101 may include a second recess structure D, and the second connection member on the support bar 201 may include a second protrusion structure C engaged with the second recess structure D.

In the embodiment of the present disclosure, the second protrusion structure C may be disposed within the second recess structure D. For example, both the second protrusion structure C and the second recess structure D are provided with threaded holes that are communicated with each other. The support frame 200 and the support base 100 may be fastened and connected to each other under engagement between the screw and the threaded hole.

It should be noted that, as shown in FIG. 10, the base body 101 is further provided with a slot E that are engaged with the shape of the shock-absorption bar 204. In this way, in the case that the support frame 200 is assembled onto the support base 100, the shock-absorption bar 204 in the support frame 200 is disposed within the slot E, which improves the stability in supporting the support frame 200 the support base 100.

In the present disclosure, as shown in FIG. 10 and FIG. 11, the shock-absorption bar 204 is further provided with a plurality of second through holes c, wherein the plurality of second through holes c may be uniformly arranged in the shock-absorption bar 204. A side of the support base 100 is provided with a plurality of second threaded holes d, connected to the plurality of second through holes c in one-to-one correspondence, and the plurality of second threaded holes d may be communicated with the slot E. In the case that the two ends of the shock-absorption bar 204 are connected to the support bar 201, the support frame 200 may be connected to the support base 100 by the threaded connection between a second screw (not illustrated in FIG. 10 and FIG. 11) and the corresponding second through hole upon the second screw passing through the second through hole c. In this way, the shock-absorption bar 204 is fixed on the support base 100, and the stability of the shock-absorption bar 204 on the support base 100 is improved.

Figure 14:
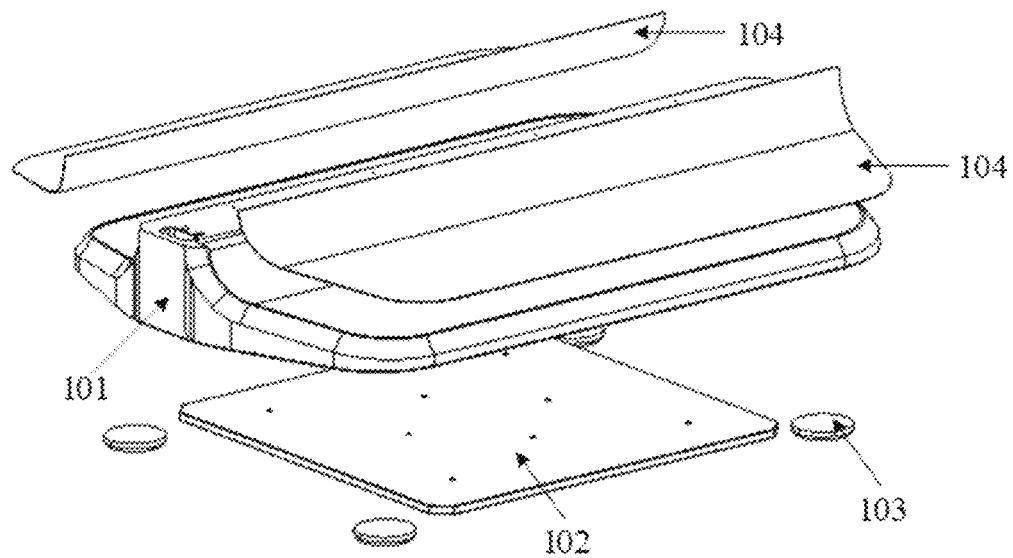
FIG. 14 is an exploded view of a support base according to an embodiment of the present disclosure.

In some embodiments, as shown in FIG. 14, which is an exploded view of a support base according to an embodiment of the present disclosure, the support base 100 may further include: a counterweight plate 102 connected to a side, distal from the support frame 200, of the base body 101. The counterweight plate 102 causes the support base 100 to more stably support the support frame 200.

In some embodiments, the support base 100 may further include: a support pad 103 connected to a side, distal from the support frame 200, of the base body 101. The number of the support pads 103 may be four, and the four support bars 103 are disposed at positions of four top corners of the base body 101 respectively.

In the embodiment of the present disclosure, as shown in FIG. 8, the glass panel 300 bonded to the first support surface 200a in the support frame 200 is provided with a transparent region 301, and a black region 302 that needs to be blackened. The transparent region 301 is the region from which the display 400 emits light. The black region 302 can maintain a color consistent with that of the display 400 in the case that the display is not displaying a picture, which improves aesthetics. As shown in FIG. 14, the support base 100 may further include: an acrylic plate 104 disposed on both sides of the base body 101. The acrylic plate 104 is made of a black plastic material, such that the support base 100 has an approximately same appearance as that of the glass panels 300 supported by the support frame 200, which effectively improves the aesthetics of the display device 00.

Figure 15:
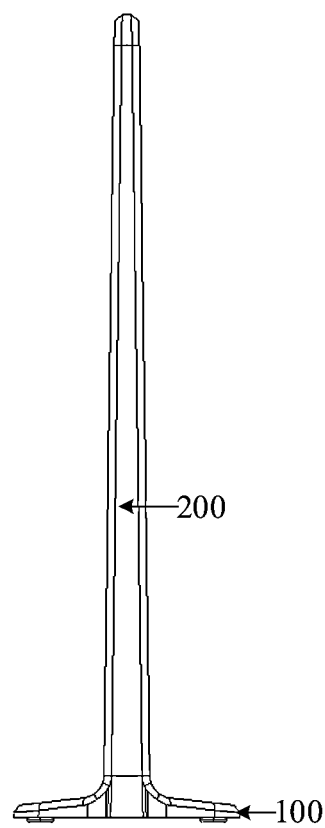
FIG. 15 is a side view of a display device according to an embodiment of the present disclosure.

In some embodiments, as shown in FIG. 15, which is a side view of a display device according to an embodiment of the present disclosure, the first support surface (not illustrated in FIG. 15) in the support frame 200 of the display device 00 is inclined relative to a bottom surface of the support base 100. In this way, in the case that the glass panel 300 is bonded to the first support surface of the support frame 200, the glass panel 300 is also inclined relative to the bottom surface of the support base 100, such that the shear force applied on the glass panel 300 is effectively reduced, and the probability that the glass panel 300 falls off from the support frame 200, due to insufficient adhesion between the glass panel 300 and the support frame 200, is reduced.

Exemplarily, the included angle between the first support surface in the support frame 200 and the bottom surface of the support base 100 ranges from 80 to 89 degrees. For example, the included angle between the first support surface in the support frame 200 and the bottom surface of the support base 100 may be 84 degrees. In this case, the included angle between the first support surface in the support frame 200 and a surface perpendicular to the bottom surface disposed of the support base 100 is 6 degrees.

In summary, the embodiments of the present disclosure also provide a method for assembling the glass panel 300 onto the support frame 200 in the display device 00. The method for assembling the glass panel 300 is as follows:

Firstly, an operator may sequentially connect a plurality of support bars 201 and the movable connection members 202 disposed between two adjacent support bars 201, and ensure that each of the movable connection members 202 is movable between the two adjacent support bars 201 connected thereto.

After that, the operator may place the glass panel 300 on the first support surface 200a of each of the support bar 201 and the movable connection member 202, and control the movable connection member 202 to be moved along the length direction of at least one support bar 201, to eliminate the gap between the bar 201 and the glass panel 300, and the gap between the movable connection member 202 and the glass panel 300.

After that, the operator may bond the glass panel 300, by a back adhesive, to the first support surface 200a of each of the support bar 201 and the movable connection member 202, and fix the support bar 201 and the movable connection member 202 using the fastener structure 203.

After that, the operator may connect the first end of the shock-absorption bar 204 to an end, distal from the movable connection member 202, of one support bar 201, and connect the second end of the shock-absorption bar 204 to an end, distal from the movable connection member 202, of another support bar 201.

Finally, the operator may assemble the support frame 200, formed by the support bar 201, the movable connection member 202 and the shock-absorption bar 204, onto the support base 100. In this way, the glass panel 300 is assembled onto the support frame 200 in the display device 00.

Figure 16:
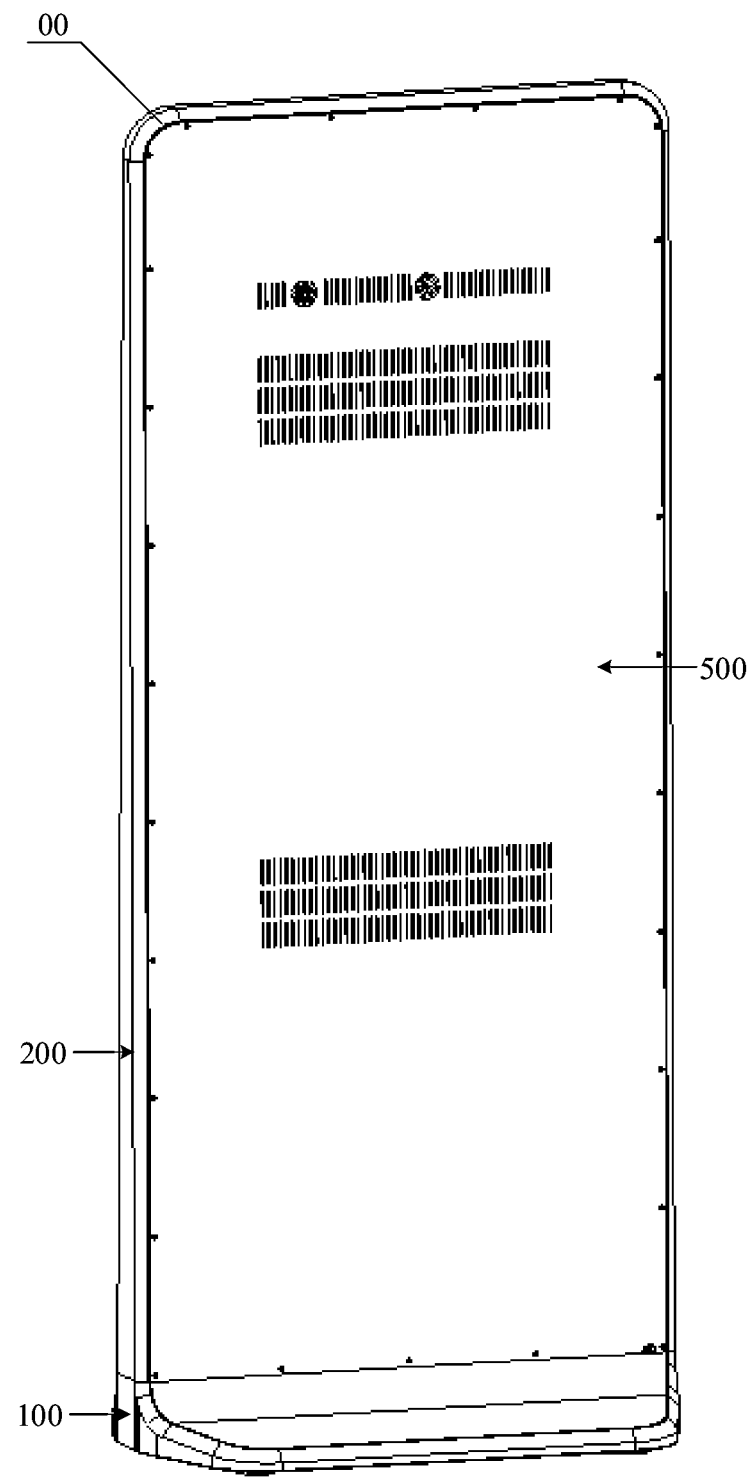
FIG. 16 is a schematic structural diagram of a display device according to an embodiment of the present disclosure.
Figure 17:
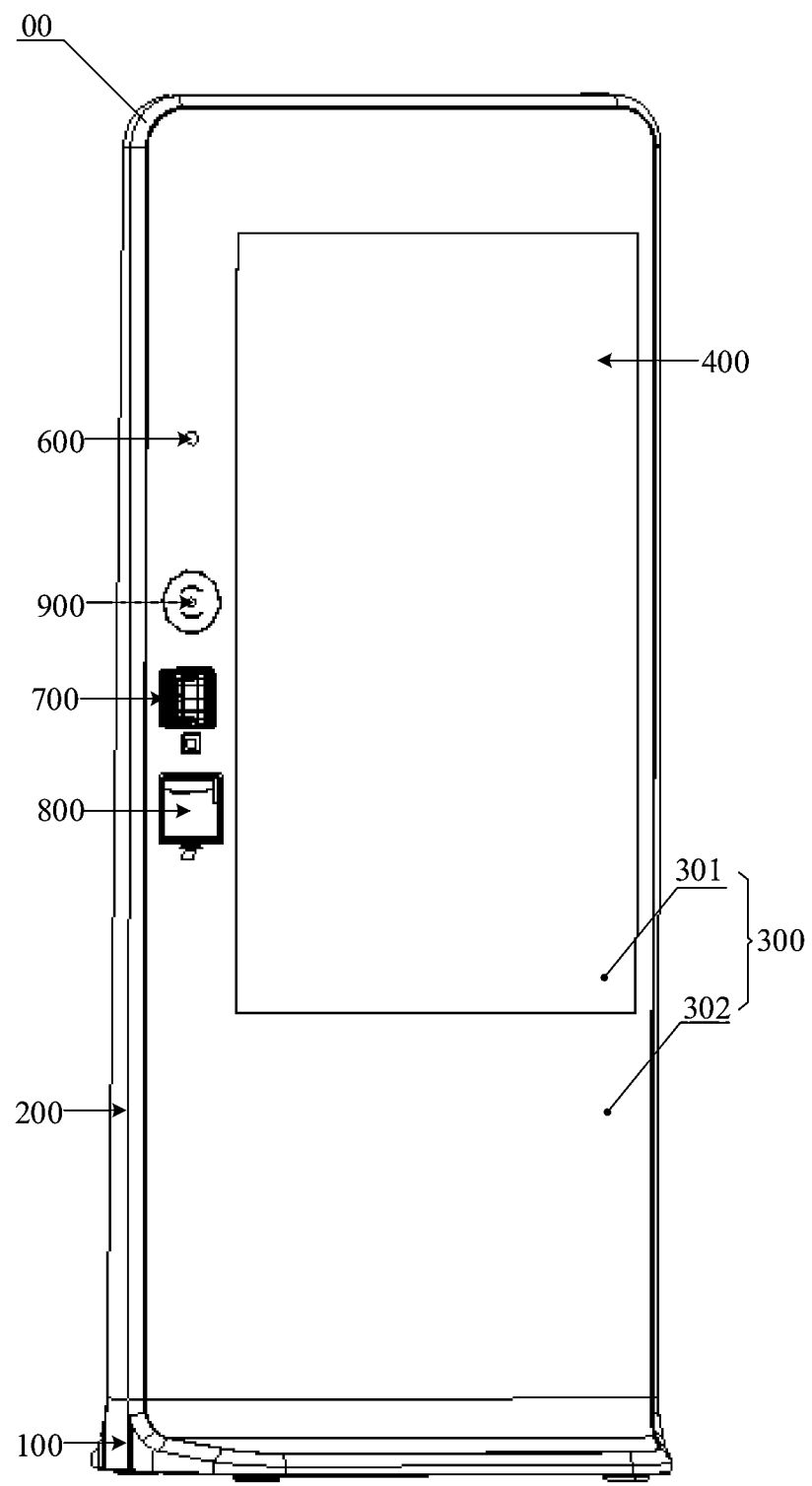
FIG. 17 is a schematic structural diagram of the display device shown in FIG. 16 on the other side.

In some embodiments, as shown in FIG. 16, which is a schematic structural diagram of a display device according to another embodiment of the present disclosure, the display device 00 may further include: a back plate 500 connected to the support frame 200. Exemplarily, as shown in FIG. 17, each of the support bar 201 and the movable connection member 202 in the support frame 200 is further provided with a second support surface (not illustrated in the FIG. 16). The second support surface may also be disposed on the bearing structure 200c, and the first support surface 200a and the second support surface that are disposed on the bearing structure 200c may be disposed opposite to each other. The back plate 500 in the display device 00 may be in contact with the second support surface, and may be fastened to the support structure 200c by screws.

In the embodiment of the present disclosure, in the display device 00, the support base 100, the support frame 200, the glass panel 300, and the back plate 500 may form a cavity. The display 400 in the display device 00 may be disposed within the cavity, and a light-emitting surface of the display 400 needs to be oriented to the transparent region 301 in the glass panel 300.

In some embodiments, the display device 00 may further include: a camera assembly 600, a scanning assembly 700, a printing assembly 800, a smart card identification assembly 900 and a communication assembly (not illustrated in FIG. 16).

In an embodiment of the present disclosure, the display device according to the embodiment of the present disclosure is applicable to a payment scenario. In this way, the display 400 in the display device may display commodity information and price information of a commodity selected by a user: the display device may have an image capture function due to the camera assembly 600, such that the user can perform a payment by swiping face: the display device may have a function of scanning quick response codes due to scanning assembly 700, such that the user can perform a payment by swiping a quick response code: the display device may have a function of swiping cards due to the smart card identification assembly 900, such that the user can perform a payment by swiping cards: the display device may have a function of printing paper receipts due to the assembly 800, such that the user may obtain paper receipts containing the commodity information and the price information upon completion of the payment: the display device may be communicated with a remote server via the communication assembly, such that the display device may to upload the relevant information about the user's shopping each time to the server for storage. The server may also send information (e.g., advertisements) that needs to be displayed by the display device to the display device.

Figure 18:
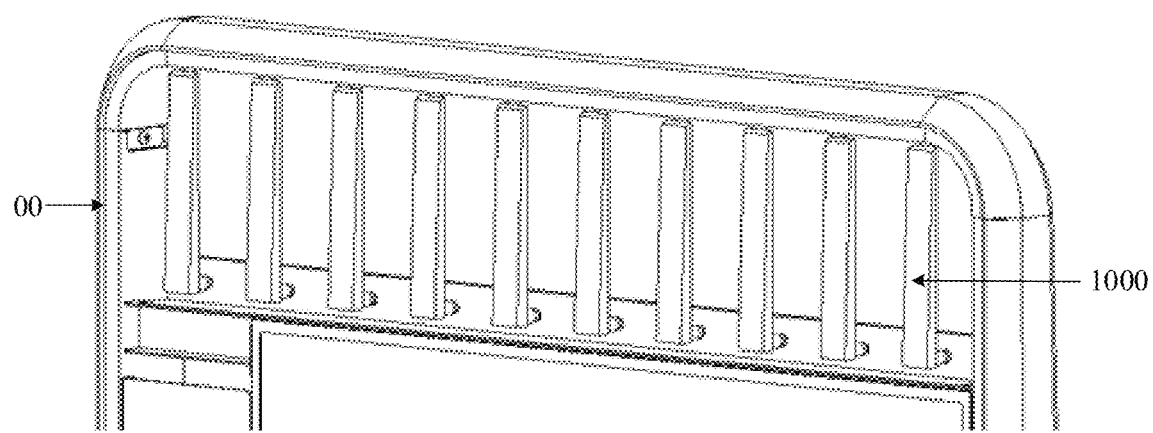
FIG. 18 is a partially enlarged view of a display device according to an embodiment of the present disclosure.

Exemplarily, the communication assembly in the display device in the embodiment of the present disclosure may be a 5G communication assembly. In this way, referring to FIG. 18. which is a partially enlarged view of a display device according to an embodiment of the present disclosure, the display device 00 may further include: a 5G antenna 1000 disposed within the cavity formed by the support base 100, the support frame 200, the glass panel 300, and a back plate 500.

In summary, the display device according to the embodiments of the present disclosure includes: a support base, a support frame, a glass panel, and a display. The support frame includes a plurality of support bars, and movable connection members, disposed between the two support bars, configured to connect the two support bars. The movable connection member is movable between the two support bars to adjust a size of the support frame. By adjusting the size of the support frame, the support frame is adapted to the glass panel even with a machining error. In this way, under the premise of ensuring that the glass panel is assembled onto the support frame, the gap between the support frame and the glass panel is avoided, and the risk that the glass panel is crushed by the support frame is eliminated.

In the present disclosure, the terms "first" and "second" are only used for descriptive purposes, and should not be construed to indicate or imply relative importance. The term "a plurality of" refers to two or more, unless definitely defined otherwise.

Described above are merely optional embodiments of the present disclosure, and are not intended to limit the present disclosure. Any modifications, equivalent substitutions, improvements and the like made within the spirit and principle of the present disclosure should be included in the protection scope of the present disclosure.

What is claimed is:

1. A display device, comprising:
    a support base;
    a support frame connected to the support base, wherein the support frame comprises: a plurality of support bars, and a movable connection member disposed between each two support bars of the plurality of support bars and configured to connect the two support bars, wherein each of the support bar and the movable connection member is provided with a first support surface, and the movable connection member is configured to move between the two support bars to adjust a size of the support frame;
    a glass panel connected to the first support surface; and
    a display disposed within a cavity formed by the support frame, the support base, and the glass panel, wherein the display is connected to the support frame.

2. The display device according to claim 1, wherein the movable connection member is provided with a first slide member, and an end, of the support bar, connected to the movable connection member is provided with a second slide member engaged with the first slide member, wherein the first slide member is slidably connected to the second slide member.

3. The display device according to claim 2, wherein the first slide member comprises a first protrusion structure, and the second slide member comprises a first recess structure engaged with the first protrusion structure, the first protrusion structure being configured to slide in the first recess structure.

4. The display device according to claim 3, wherein the support frame further comprises: a fastener structure configured to fix the support bar to the movable connection member.

5. The display device according to claim 4, wherein the fastener structure comprises: a fastener hole communicated with the first recess structure, an adjustment hole disposed in the first protrusion structure, and a fastener member;
    wherein a second end of the fastener member is connected to the fastener hole upon passing through the adjustment hole.

6. The display device according to claim 5, wherein the adjustment hole in the first protrusion structure is a waist-shaped hole, a length direction of the waist-shaped hole being consistent with a length direction of the support bar connected to the first protrusion structure.

7. The display device according to claim 2, wherein the first slide member comprises a first recess structure, and the second slide member comprises a first protrusion structure engaged with the first recess structure, the first protrusion structure being configured to slide in the first recess structure.

8. The display device according to claim 2, wherein the support frame further comprises: a shock-absorption bar configured to abut against the glass panel, a first end of the shock-absorption bar being connected to one of the support bars, and a second end of the shock-absorption bar being connected to another one of the support bars.

9. The display device according to claim 2, wherein the support base comprises: a base body provided with two first connection members; and
    two support bars of the plurality of support bars are each provided with a second connection member, wherein the second connection member is disposed on an end, distal from the movable connection member, of each of the two support bars, and the first connection member is configured to be connected to the second connection member.

10. The display device according to claim 1, wherein each of the support bar and the movable connection member comprises: a protection structure and a bearing structure that are connected to each other, wherein the protection structure is protruded relative to the bearing structure, and the bearing structure is provided with a first support surface, the first support surface being bonded to the glass panel.

11. The display device according to claim 1, wherein the support frame further comprises: a shock-absorption bar configured to abut against the glass panel, a first end of the shock-absorption bar being connected to one of the support bars, and a second end of the shock-absorption bar being connected to another one of the support bars.

12. The display device according to claim 11, wherein the shock-absorption bar comprises: a first sub-shock-absorption bar and a second sub-shock-absorption bar that are connected to each other, wherein the first sub-shock-absorption bar is configured to abut against a side surface of the glass panel, and the second sub-shock-absorption bar is configured to support an edge region of the glass panel.

13. The display device according to claim 11, wherein the support frame comprises: a first support bar, a second support bar, and a third support bar; wherein the first support bar and the second support bar are connected by one of the movable connection members; the second support bar and the third support bar are connected by another one of the movable connection members; an end, distal from the movable connection member, of the first support bar is connected to the first end of the shock-absorption bar; and an end, of the third support bar, distal from the movable connection member is connected to the second end of the shock-absorption bar.

14. The display device according to claim 1, wherein the support base comprises: a base body provided with two first connection members; and
    two support bars of the plurality of support bars are each provided with a second connection member, wherein the second connection member is disposed on an end, distal from the movable connection member, of each of the two support bars, and the first connection member is configured to be connected to the second connection member.

15. The display device according to claim 14, wherein the first connection member comprises a second protrusion structure, and the second connection member comprises a second recess structure engaged with the second protrusion structure, the second protrusion structure being disposed within the second recess structure.

16. The display device according to claim 14, wherein the support base further comprises: a counterweight plate connected to a side, distal from the support frame, of the base body.

17. The display device according to claim 14, wherein the first connection member comprises a second recess structure, and the second connection member comprises a second protrusion structure engaged with the second recess structure, the second protrusion structure being disposed within the second recess structure.

18. The display device according to claim 1, wherein the first support surface is inclined relative to a bottom surface of the support base.

19. The display device according to claim 1, wherein each of the support bar and the movable connection member is further provided with a second support surface; and the display device further comprises: a back plate connected to the second support surface.

* * * * *